US010833006B2

(12) United States Patent
Yoshimori et al.

(10) Patent No.: US 10,833,006 B2
(45) Date of Patent: Nov. 10, 2020

(54) SEMICONDUCTOR DEVICE

(71) Applicant: Toshiba Memory Corporation, Tokyo (JP)

(72) Inventors: Hiromasa Yoshimori, Yokohama Kanagawa (JP); Masayuki Ako, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/280,998

(22) Filed: Feb. 20, 2019

(65) Prior Publication Data
US 2020/0075481 A1 Mar. 5, 2020

(30) Foreign Application Priority Data
Sep. 4, 2018 (JP) .................. 2018-165063

(51) Int. Cl.
H01L 23/522 (2006.01)
H01L 27/11582 (2017.01)
H01L 27/11556 (2017.01)

(52) U.S. Cl.
CPC .... *H01L 23/5226* (2013.01); *H01L 27/11582* (2013.01); *H01L 27/11556* (2013.01)

(58) Field of Classification Search
CPC ..................... H01L 21/76898; H01L 23/481
See application file for complete search history.

(56) References Cited

U.S. PATENT DOCUMENTS

| 9,214,411 | B2 | 12/2015 | Park et al. |
| 9,379,042 | B2 | 6/2016 | Park et al. |
| 9,558,945 | B2 | 1/2017 | Fukuzumi et al. |
| 2006/0001174 | A1* | 1/2006 | Matsui .................. H01L 23/552 257/774 |
| 2016/0268304 | A1 | 9/2016 | Ikeda et al. |

FOREIGN PATENT DOCUMENTS

| JP | 2015079960 A | 4/2015 |
| JP | 2016171243 A | 9/2016 |

* cited by examiner

*Primary Examiner* — Daniel P Shook
(74) *Attorney, Agent, or Firm* — Kim & Stewart LLP

(57) ABSTRACT

A semiconductor device includes a substrate, a first electrode provided apart from the surface of the substrate in a first direction intersecting the surface of the substrate, a second electrode extending completely through the substrate in the first direction and connected to the first electrode at one end in the first direction, a first structure covering a side surface of the second electrode, and an insulating film provided between the second electrode and the first structure. The second electrode includes first atoms, and the first structure includes second atoms. A diffusion coefficient of the second atoms in the insulating film is smaller than a diffusion coefficient of the first atoms in the insulating film.

18 Claims, 20 Drawing Sheets

SEMICONDUCTOR DEVICE

CROSS-REFERENCE TO RELATED APPLICATION

This application is based upon and claims the benefit of priority from Japanese Patent Application No. 2018-165063, filed Sep. 4, 2018, the entire contents of which are incorporated herein by reference.

FIELD

Embodiments described herein relate generally to a semiconductor device.

BACKGROUND

High density integration of semiconductor devices is progressing.

DETAILED DESCRIPTION

In general, according to one embodiment, a semiconductor device includes a substrate, a first electrode provided apart from the surface of the substrate in a first direction intersecting the surface of the substrate, a second electrode extending completely through the substrate in the first direction and connected to the first electrode at one end in the first direction, a first structure covering a side surface of the second electrode, and an insulating film provided between the second electrode and the first structure. The second electrode includes first atoms, and the first structure includes second atoms. A diffusion coefficient of the second atoms in the insulating film is smaller than a diffusion coefficient of the first atoms in the insulating film.

Next, a semiconductor device according to embodiments will be described in detail with reference to the drawings. It is noted that the following embodiments are merely examples, and are not intended to limit the scope of the present disclosure.

Further, in this specification, "above", "below" and the like are expressed with reference to a substrate. For example, when a direction intersecting the surface of the substrate is defined as a first direction, a direction away from the substrate along the first direction is referred to as an upward direction, and a direction approaching the substrate is referred to as a downward direction. In addition, an expression that one component is provided "above the substrate" means that the component is provided apart from the substrate in the first direction. Further, an expression that another component is provided "below" one component means that the other component is closer to the substrate than the one component when both components are above the substrate. Further, when a direction intersecting the first direction is defined as a second direction, a surface intersecting the second direction is referred to as a side surface or the like.

First Embodiment

[Configuration]

Figure 1:
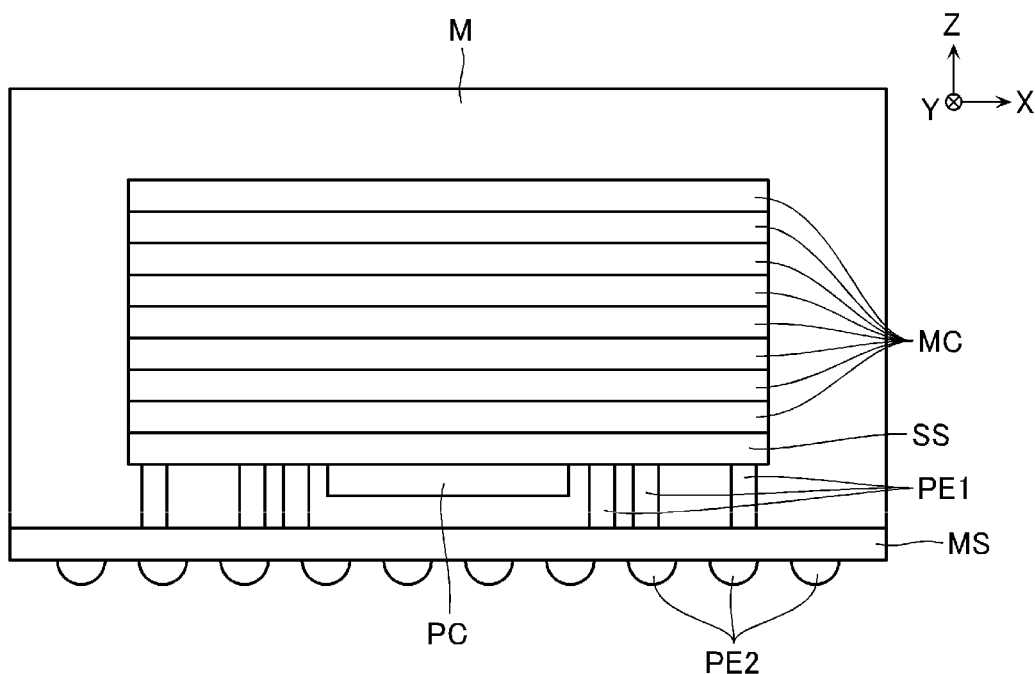
FIG. 1 is a schematic cross-sectional view of a semiconductor device according to a first embodiment.

FIG. 1 is a schematic cross-sectional view of a semiconductor device according to a first embodiment. For the sake of convenience of explanation, some components are not shown in FIG. 1.

The semiconductor device according to the first embodiment includes a mounting substrate MS, a supporting substrate SS provided above the mounting substrate MS, a plurality of memory chips MC stacked on the supporting substrate SS, a processor chip PC connected to the memory chips MC, and a mold M for sealing the memory chips MC and the processor chip PC.

A plurality of protruding electrodes PE1 are provided on an upper surface of the mounting substrate MS. Each of the protruding electrodes PE1 is connected to a wiring, not shown, provided on the mounting substrate MS. A plurality of protruding electrodes PE2 are also provided on a lower surface of the mounting substrate MS. The protruding electrodes PE2 are used for connection between the semiconductor device according to the embodiment and a host computer or the like.

The memory chips MC are, for example, chips each including a three-dimensional NAND flash memory. The memory chips MC are attached to each other via an adhesive or the like. In addition, the memory chips MC each include an electrode TSV (commonly referred to as a through-surface via electrode) penetrating a semiconductor substrate S of the memory chip MC (refer to FIG. 3), and the memory chips MC are electrically connected to each other via the electrode TSV.

The processor chip PC is electrically connected to each memory chip MC via the electrode TSV. For example, the processor chip PC transmits and receives data (e.g., user data, logical address data, and external command data) to and from a host computer, and transmits and receives data (e.g., user data, physical address data, and internal command data) to and from the memory chip MC. Further, the processor chip PC performs processing, including conversion/allocation of logical address data and physical address data, error detection/correction, and wear leveling.

Figure 2:
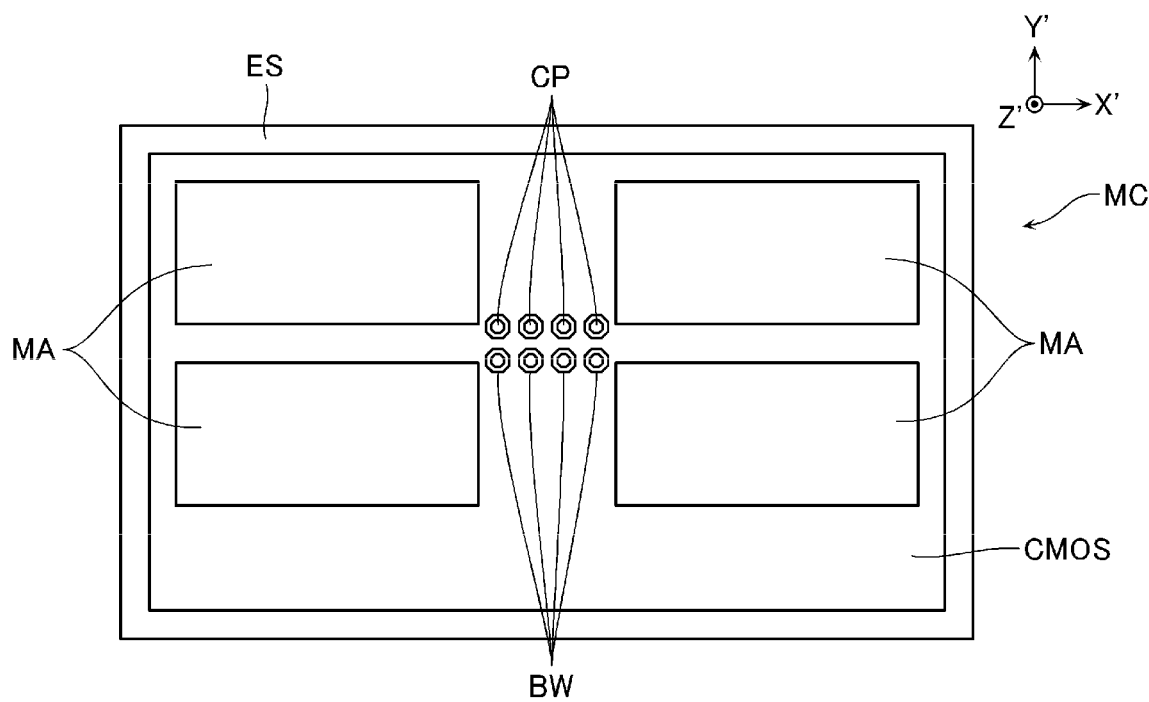
FIG. 2 is a schematic plan view of a memory chip of the semiconductor device.
Figure 3:
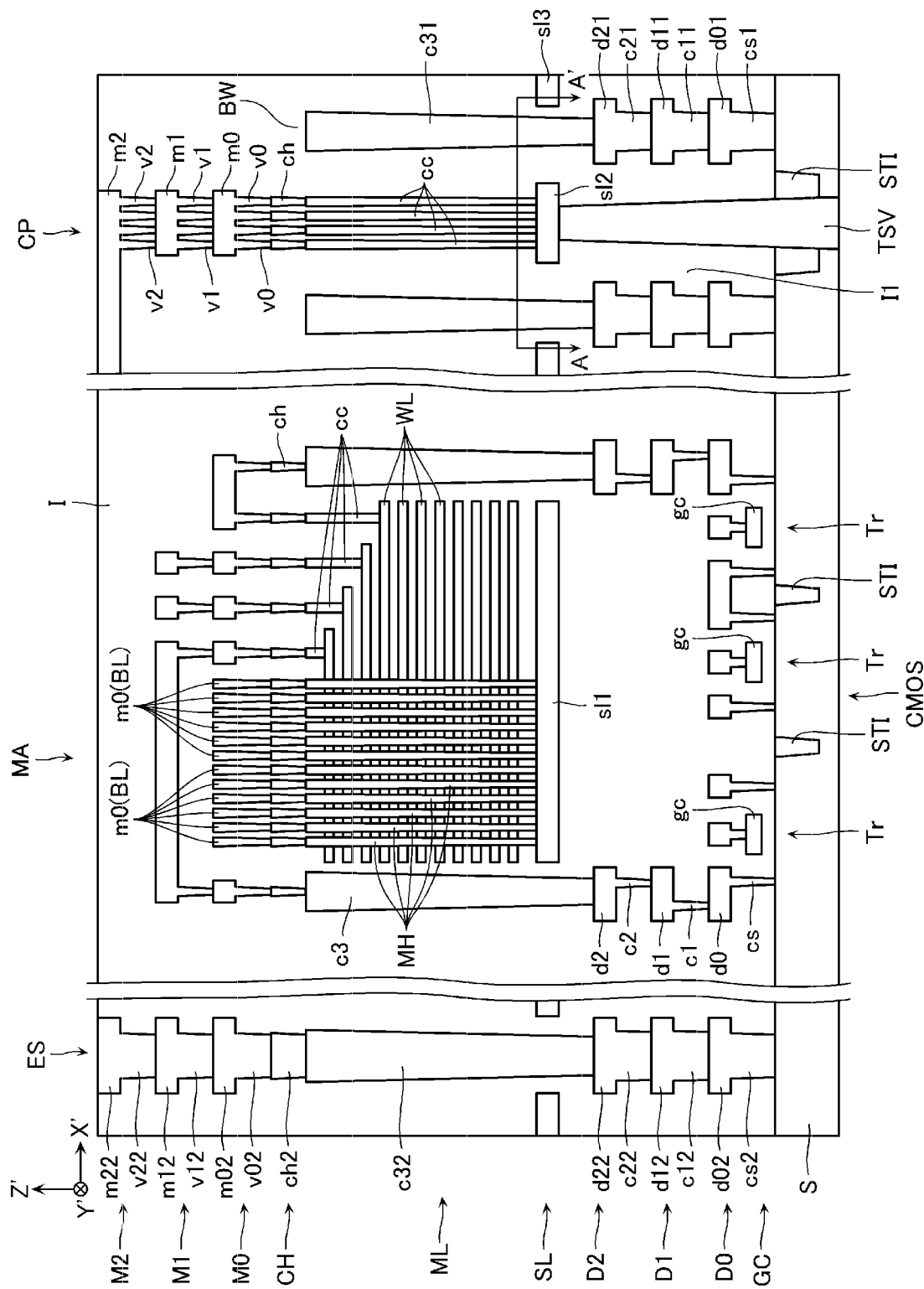
FIG. 3 is a schematic cross-sectional view of the memory chip MC.

Next, a schematic configuration of the memory chip MC will be described with reference to FIGS. 2 and 3. FIG. 2 is a schematic plan view of the memory chip MC. FIG. 3 is a schematic cross-sectional view of the memory chip MC. For the sake of convenience of explanation, some components are not shown in FIGS. 2 and 3.

It is noted that, in FIGS. 2 and 3, coordinate systems X', Y', and Z' are shown. For example, Z' may coincide or substantially coincide with Z or −Z in FIG. 1. Further, X' may coincide or substantially coincide with any one of X, −X, Y, and −Y in FIG. 1. Furthermore, Y' may coincide or substantially coincide with any one of Y, −Y, X, and −X in FIG. 1.

As shown in FIG. 2, the memory chip MC includes a memory cell array MA, a peripheral circuit CMOS provided around the memory cell array MA, a connection portion CP for electrically connecting the circuit CMOS to the processor chip PC (shown in FIG. 1), a barrier wall BW surrounding the connection portion CP, and an edge seal ES extending along the outer edge of the memory chip MC and surrounding the memory cell array MA, the circuit CMOS, the connection portion CP and the barrier wall BW. In the illustrated example, four memory cell arrays MA are arranged in the X' direction and the Y' direction, and a plurality of connection portions CP are provided near the center of the memory cell arrays MA.

As shown in FIG. 3, each of the memory cell arrays MA includes a plurality of word lines WL stacked in the Z' direction and a plurality of memory structures MH extending in the Z' direction and penetrating the plurality of word lines WL. Between the plurality of word lines WL, an insulating film is provided. Each word line WL is a wiring of, for example, titanium nitride (TiN) and tungsten (W), and has a substantially plate-like shape extending in the X' direction. The memory structure MH has, for example, a substantially columnar shape, and includes a stacked film of silicon oxide, silicon nitride ($Si_3N_4$), silicon oxide, polycrystalline silicon and the like. That is, a silicon pillar extending in the Z' direction penetrates the word line WL, thereby at the crossing portion, a memory cell is formed. The memory cell has a memory structure of gate/silicon oxide/silicon nitride ($Si_3N_4$)/silicon oxide/silicon. It is noted that the configuration of the memory cell array MA may be appropriately changed. For example, the word line WL may be a wiring such as polycrystalline silicon containing impurities. In addition, the memory structure MH may be provided with a floating gate of, such as, polycrystalline silicon containing impurities, instead of silicon nitride.

The circuit CMOS is a CMOS (complementary MOS) circuit including a plurality of field-effect transistors Tr. The transistors Tr are connected to the memory cell array MA via a plurality of wirings and contacts. For example, the circuit CMOS includes an operation voltage generation circuit that generates operation voltage of a predetermined magnitude from the power supply voltage supplied through the connection portion CP, and an operation voltage transfer circuit that supplies the operation voltage to each component in the memory cell array MA. For example, the circuit CMOS also includes an input/output circuit for receiving data from the processor chip PC via the connection portion CP, and a register circuit for holding the data. Further, for example, the circuit CMOS also includes a sense amplifier circuit for reading user data from the memory structure MH or applying voltage to the memory structure MH according to the user data, an address decode circuit for decoding physical address data to control the voltage transfer circuit, and a sequencer circuit for decoding internal command data to control each component in the circuit CMOS.

The connection portion CP extends in the Z' direction from the bottom surface to the upper surface of the memory chip MC. The connection portion CP is electrically connected to the circuit CMOS via a contact, not shown, or the like, and supplies the power supply voltage, data, and the like input from the processor chip PC to the circuit CMOS. It is noted that, as described above, the connection portion CP includes the electrode TSV. The electrode TSV is a substantially columnar electrode extending in the Z' direction. The electrode TSV penetrates the semiconductor substrate S, and the lower end thereof is exposed on the bottom surface of the memory chip MC. The electrode TSV is, for example, an electrode of, such as, nickel (Ni) or platinum (Pt). Hereinafter, atoms contained in the electrode TSV may sometimes be referred to as "first atoms".

The barrier wall BW prevents diffusion of the first atoms contained in the electrode TSV. The barrier wall BW has, for example, a substantially polygonal tubular shape or a substantially cylindrical shape, and covers side surfaces in the X' direction and the Y' direction of the connection portion CP. The upper end of the barrier wall BW is located above the electrode TSV, so that diffusion of the first atoms can be prevented by the barrier wall BW. The barrier wall BW includes, for example, a stacked film of titanium nitride and tungsten. Hereinafter, atoms contained in the barrier wall BW may sometimes be referred to as "second atoms".

The edge seal ES prevents diffusion of substances generated during wafer dicing into the memory cell array MA or the like in the manufacturing process of the memory chip MC.

Figure 4:
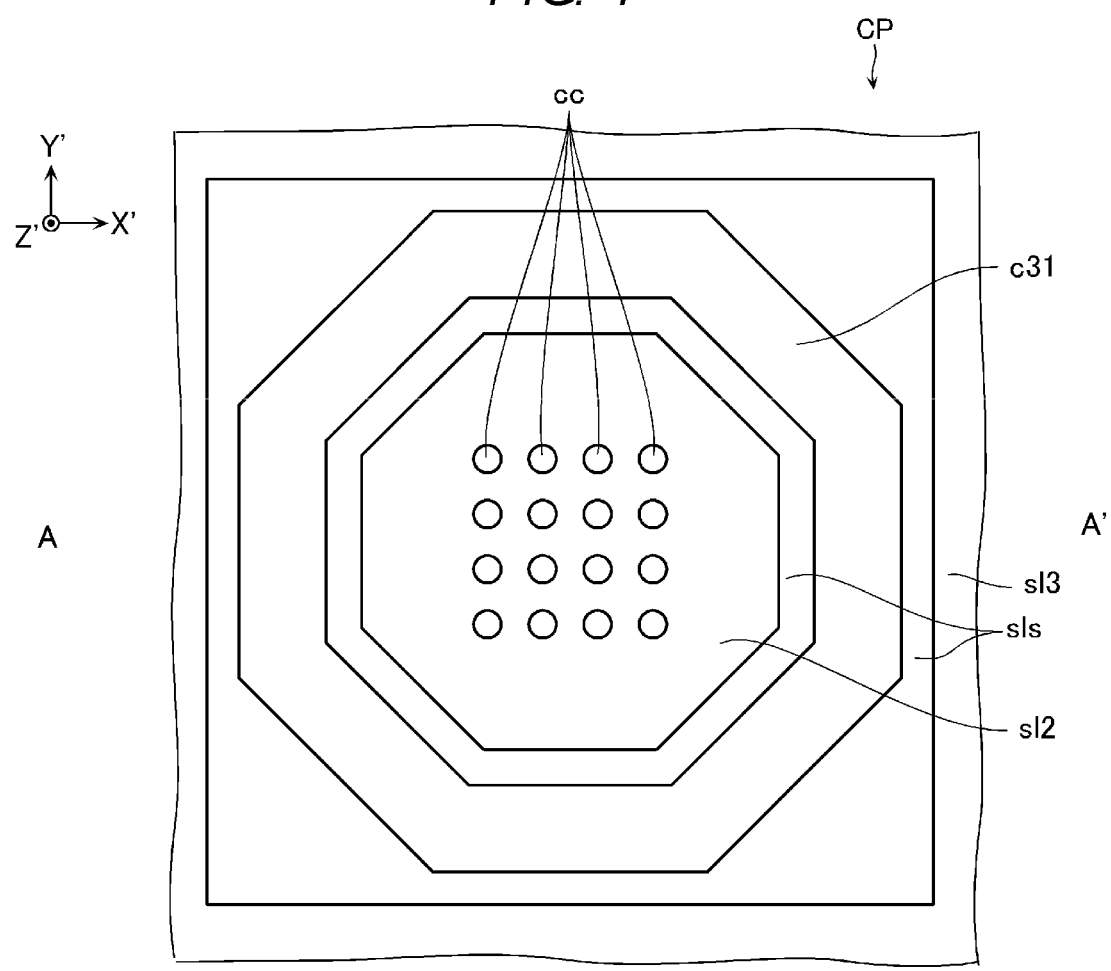
FIG. 4 is a schematic plan view of a connection portion of the semiconductor device.

Next, the wiring structure and the like of the memory chip MC will be described with reference to FIGS. 3 and 4. FIG. 4 is a schematic plan view of the structure shown in FIG. 3 taken along the line A-A' and viewed in the direction of the arrow. For the sake of convenience of explanation, some components are not shown in FIGS. 3 and 4.

As shown in FIG. 3, the memory chip MC includes the semiconductor substrate S, and an electrode layer GC, metal wiring layers D0, D1 and D2, a semiconductor wiring layer SL, a memory layer ML, a contact layer CH, and metal wiring layers M0, M1, M2 provided in that order on the semiconductor substrate S. Further, an insulating portion I of, such as, silicon oxide is buried between these components. The insulating portion I includes an insulating film I1 provided between the electrode TSV and the barrier wall BW, for example.

The semiconductor substrate S is, for example, a silicon substrate containing P-type impurities such as boron (B). An N-type well, not shown, is provided on a part of the surface of the semiconductor substrate S. The N-type well contains N-type impurities such as phosphorus (P). In addition, a P-type well, not shown, is provided on a part of the N-type well. The P-type well contains P-type impurities such as boron (B). Further, an insulating portion STI of, such as, silicon oxide ($SiO_2$) is provided on the surface of the semiconductor substrate S.

The electrode layer GC includes a plurality of electrodes gc. Each of the electrodes gc faces the surface of the semiconductor substrate S, and functions as a gate electrode of the transistor Tr. The electrode gc includes, for example, a stacked film of polycrystalline silicon, titanium nitride, and tungsten.

The metal wiring layer D0 includes a plurality of wirings d0. A substantially columnar contact cs extending in the Z' direction is provided on each lower surface of at least some of the wirings d0. The upper end of the contact cs is connected to the lower surface of the wiring d0, and the lower end of the contact cs is connected to the surface of the semiconductor substrate S or the upper surface of the electrode gc.

In addition, the metal wiring layer D0 includes annular portions d01 and cs1 forming a part of the barrier wall BW. The annular portions d01 and cs1 are polygonal annular or annular members when viewed from the Z' direction, and surround the outer peripheral surface of the electrode TSV. The upper surface of the annular portion cs1 is connected to the lower surface of the annular portion d01, and the lower surface of the annular portion cs1 is connected to the surface of the semiconductor substrate S.

Further, the metal wiring layer D0 includes annular portions d02 and cs2 forming a part of the edge seal ES. The annular portions d02 and cs2 extend in the X' direction and the Y' direction along the outer edge of the memory chip MC when viewed from the Z' direction. The upper surface of the annular portion cs2 is connected to the lower surface of the annular portion d02, and the lower surface of the annular portion cs2 is connected to the surface of the semiconductor substrate S.

It is noted that each of the components d0, cs, d01, cs1, d02, cs2 in the metal wiring layer D0 includes, for example, a stacked film of titanium nitride and tungsten.

The metal wiring layer D1 includes a plurality of wirings d1, a plurality of contacts c1, and annular portions d11, c11, d12, c12. These components are configured substantially in the same manner as the plurality of wirings d0, the plurality of contacts cs, and the annular portions d01, cs1, d02, cs2, respectively. However, the arrangement of the wirings d1 and contacts c1 is different from the arrangement of the wirings d0 and contacts cs. Further, the metal wiring layer D1 is provided above the metal wiring layer D0, and the lower ends of the contacts c1, the annular portion c11, and the annular portion c12 are connected to the upper surfaces of the wirings d0, the annular portion d01, and the annular portion d02, respectively.

The metal wiring layer D2 includes a plurality of wirings d2, a plurality of contacts c2, and annular portions d21, c21, d22, c22. These components are configured substantially in the same manner as the plurality of wirings d0, the plurality of contacts cs, and the annular portions d01, cs1, d02, cs2, respectively. However, the arrangement of the wirings d2 and contacts c2 is different from the arrangement of the wirings d0 and contacts cs. Further, the metal wiring layer D2 is provided above the metal wiring layer D1, and the lower ends of the contacts c2, the annular portion c21, and the annular portion c22 are connected to the upper surfaces of the wirings d1, the annular portion d11, and the annular portion d12, respectively.

The semiconductor wiring layer SL includes a semiconductor wiring s11. The semiconductor wiring s11 is connected to the lower end of the memory structure MH, and functions as a source line of the memory cell array MA. Further, the semiconductor wiring layer SL includes a semiconductor electrode s12 forming a part of the connection portion CP, and a proximity portion s13 close to the semiconductor electrode s12. The lower surface of the semiconductor electrode s12 is connected to the upper end of the electrode TSV. As shown in FIG. 4, the semiconductor electrode s12 and the proximity portion s13 are divided by a groove s1s, and the semiconductor electrode s12 and the proximity portion s13 are electrically insulated from each other. The semiconductor wiring s11, the semiconductor electrode s12 and the proximity portion s13 are formed as the same layer. It is noted that these components include, for example, a semiconductor film containing impurities, such as phosphorus and boron. In addition to such a semiconductor film or the like, these components may include a stacked film of titanium nitride and tungsten. In this way, diffusion of the first atoms can be prevented more favorably.

As shown in FIG. 3, the memory layer ML includes the memory cell array MA. Further, the memory layer ML includes a plurality of contacts cc and c3. In addition, the memory layer ML includes a tubular portion c31 forming a part of the barrier wall BW, and a tubular portion c32 forming a part of the edge seal ES.

The contacts cc are substantially columnar contacts extending in the Z' direction. The lower ends of some of the contacts cc are connected to the upper surfaces of the word lines WL to electrically connect the word lines WL to the circuit CMOS. Further, the lower ends of some of the contacts cc are connected to the upper surface of the semiconductor electrode s12 to form a part of the connection portion CP. It is noted that, as shown in FIG. 4, the connection portion CP includes a plurality of contacts cc arranged in the X' direction and the Y' direction.

As shown in FIG. 3, the contacts c3 are substantially columnar contacts extending in the Z' direction. The lower ends of the contacts c3 are connected to the upper surfaces of the wirings d2 or the like in the metal wiring layer D2.

The tubular portion c31 is a polygonal tubular or cylindrical member extending in the Z' direction. For example, in the example of FIG. 4, the tubular portion c31 has an octagonal tubular shape, and surrounds the outer peripheral surface of the semiconductor electrode s12. Further, the tubular portion c32 (FIG. 3) extends in the X' direction and the Y' direction along the outer edge of the memory chip MC. The lower ends of the tubular portions c31 and c32 are connected to the upper surfaces of the annular portions d21 and d22, respectively. It is noted that these components include, for example, a stacked film of titanium nitride and tungsten.

The contact layer CH includes a plurality of contacts ch. The contacts ch are substantially columnar contacts extending in the Z' direction. The lower ends of the contacts ch are connected to the upper ends of the memory structure MH, and the contacts cc, c3, respectively. Further, the contact layer CH includes an annular portion ch2 forming a part of the edge seal ES. The annular portion ch2 is configured in substantially the same manner as the annular portion cs2. However, the annular portion ch2 is provided above the annular portion cs2, and the lower end of the annular portion ch2 is connected to the upper surface of the tubular portion c32. It is noted that these components include, for example, a stacked film of titanium nitride and tungsten.

The metal wiring layer M0 includes a plurality of wirings m0, a plurality of contacts v0, and annular portions m02 and v02. These components are configured substantially in the same manner as the plurality of wirings d0, the plurality of contacts cs, and the annular portions d02 and cs2, respectively. However, the arrangement of the wirings m0 and contacts v0 is different from the arrangement of the wirings d0 and contacts cs. For example, some of the wirings m0 are connected to the memory structure MH via the contacts ch, and function as bit lines BL. Further, the metal wiring layer M0 is provided above the contact layer CH, and the lower ends of the contacts v0 and the annular portion v02 are connected to the upper ends of the contacts ch and the annular portion ch2, respectively. It is noted that these components include, for example, a stacked film of titanium nitride and tungsten.

The metal wiring layer M1 includes a plurality of wirings m1, a plurality of contacts v1, and annular portions m12 and v12. These components are configured substantially in the same manner as the plurality of wirings m0, the plurality of contacts v0, and the annular portions m02 and v02, respectively. However, the arrangement of the wirings m1 and contacts v1 is different from the arrangement of the wirings d0 and contacts v0. Further, the metal wiring layer M1 is provided above the metal wiring layer M0, and the lower ends of the contacts v1 and the annular portion m02 are connected to the upper surfaces of the wirings m0 and the annular portion m02, respectively. It is noted that these components include, for example, a stacked film of titanium nitride and copper (Cu).

The metal wiring layer M2 includes a plurality of wirings m2, a plurality of contacts v2, and annular portions m22 and v22. These components are configured substantially in the same manner as the plurality of wirings m0, the plurality of contacts v0, and the annular portions m02 and v02, respectively. However, the arrangement of the wirings m2 and contacts v2 is different from the arrangement of the wirings m0 and contacts v0. For example, in the illustrated example, each of the wirings m2 extends in the X' direction. The wiring m2 is connected to the circuit CMOS via a contact, not shown, or the like. Further, the metal wiring layer M2 is provided above the metal wiring layer M1, and the lower ends of the contacts v2 and the annular portion v22 are connected to the upper surfaces of the wirings m1 and the annular portion m12, respectively. It is noted that these components include, for example, a stacked film of titanium nitride and aluminum (Al).

[Manufacturing Method]

Next, a manufacturing method of the semiconductor device according to the embodiment will be described with reference to FIGS. 5 to 20. For the sake of convenience of explanation, some components are not shown in FIGS. 5 to 20.

Figure 5:
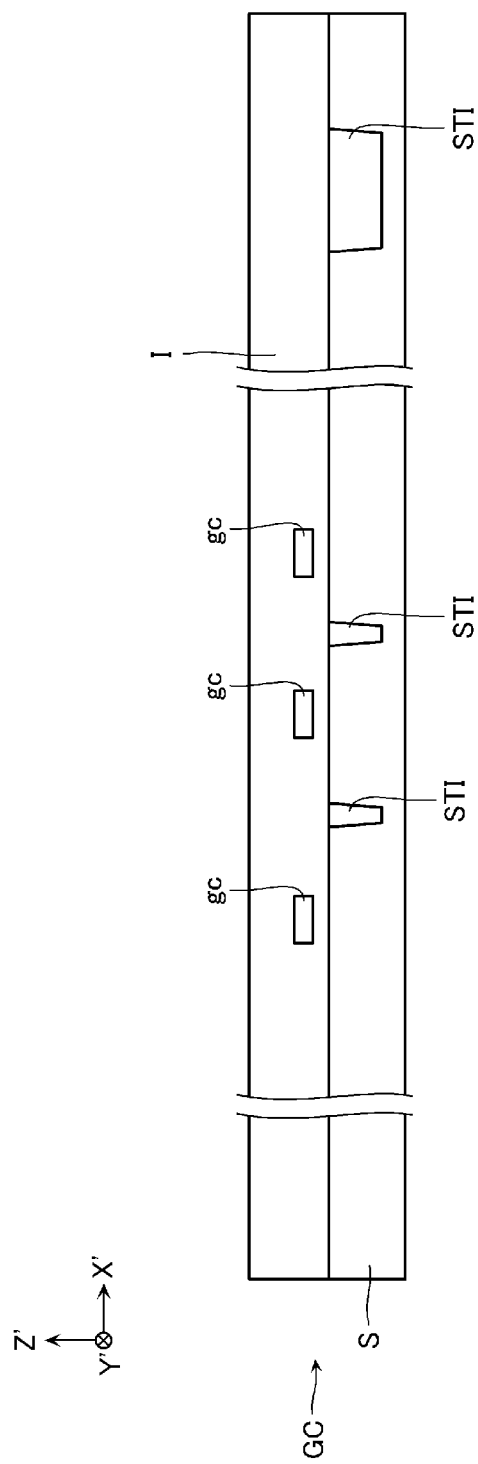
FIGS. 5-16 and 18-20 are each a schematic cross-sectional view illustrating a step in a method of manufacturing the semiconductor device according to the first embodiment.

As shown in FIG. 5, in the manufacturing method according to the embodiment, the insulating portion STI (Shallow Trench Isolation) is formed on the surface of the semiconductor substrate S by CVD or thermal oxidation processing or the like. Next, the electrode layer GC is formed on the semiconductor substrate S. This process is performed by a method such as CVD (Chemical Vapor Deposition), and RIE (Reactive Ion Etching). Further, the insulating portion I covering these components is formed by CVD or the like.

Figure 6:
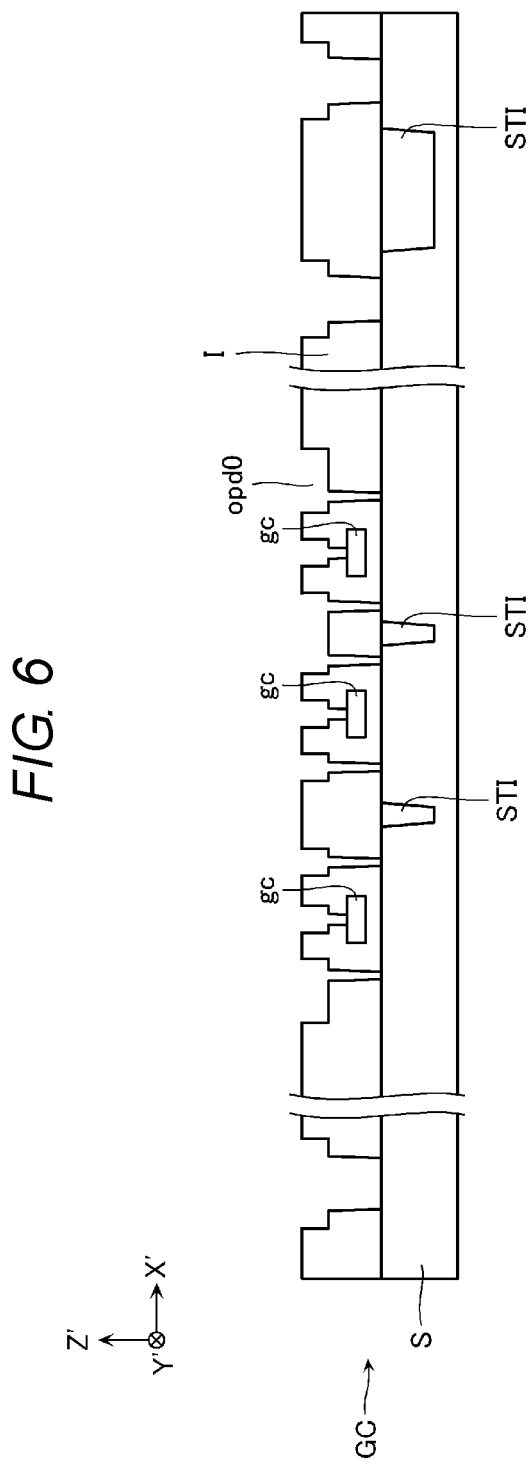
Figure 7:
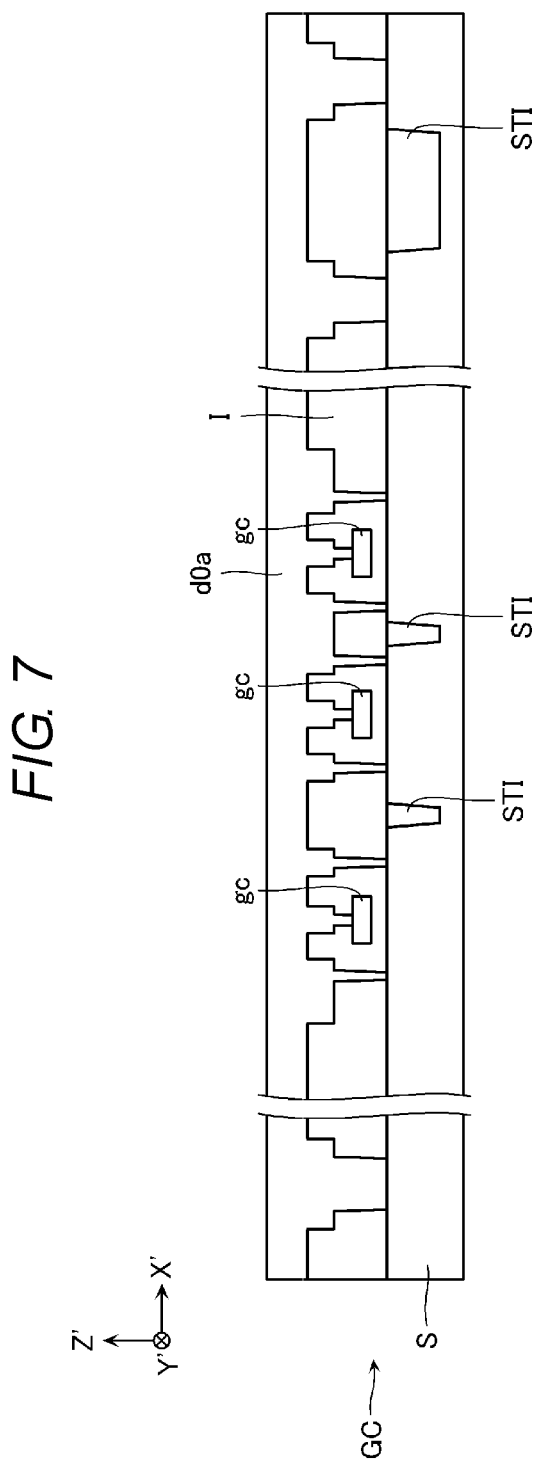
Figure 8:
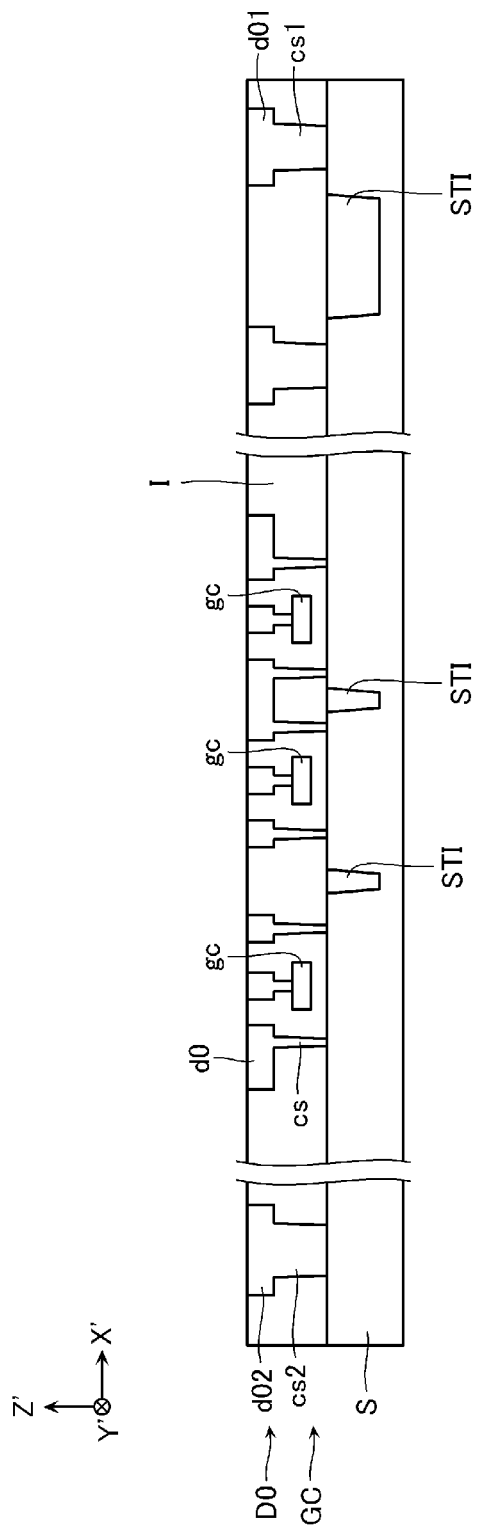

Next, as shown in FIGS. 6 to 8, the metal wiring layer D0 is formed. This process is performed by using, for example, the damascene method. That is, as shown in FIG. 6, an opening opd0 is first formed in the insulating portion I by a method such as RIE. Next, as shown in FIG. 7, a stacked film d0a of titanium nitride and tungsten is formed by a method such as CVD. Next, as shown in FIG. 8, a part of the stacked film is removed by a method such as CMP (Chemical Mechanical Polishing) to form the metal wiring layer D0.

Figure 9:
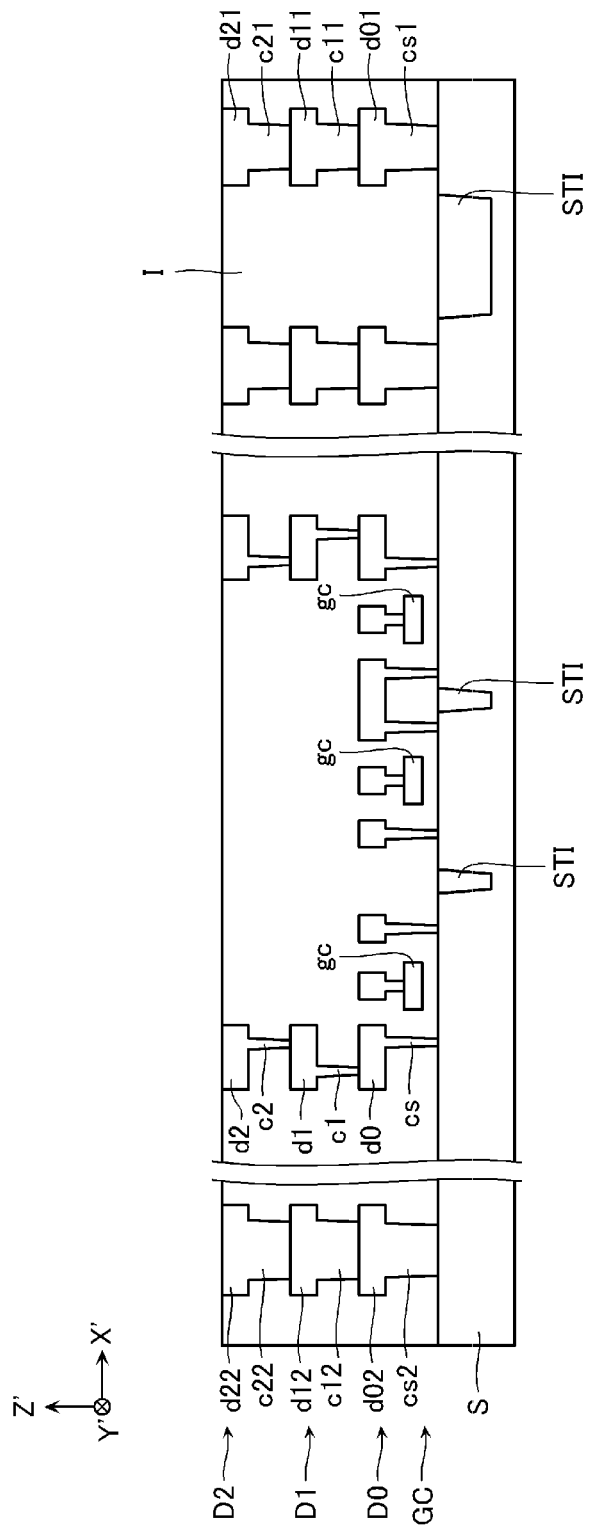

Next, as shown in FIG. 9, metal wiring layers D1 and D2 are formed. This process is performed by using, for example, the damascene method.

Figure 10:
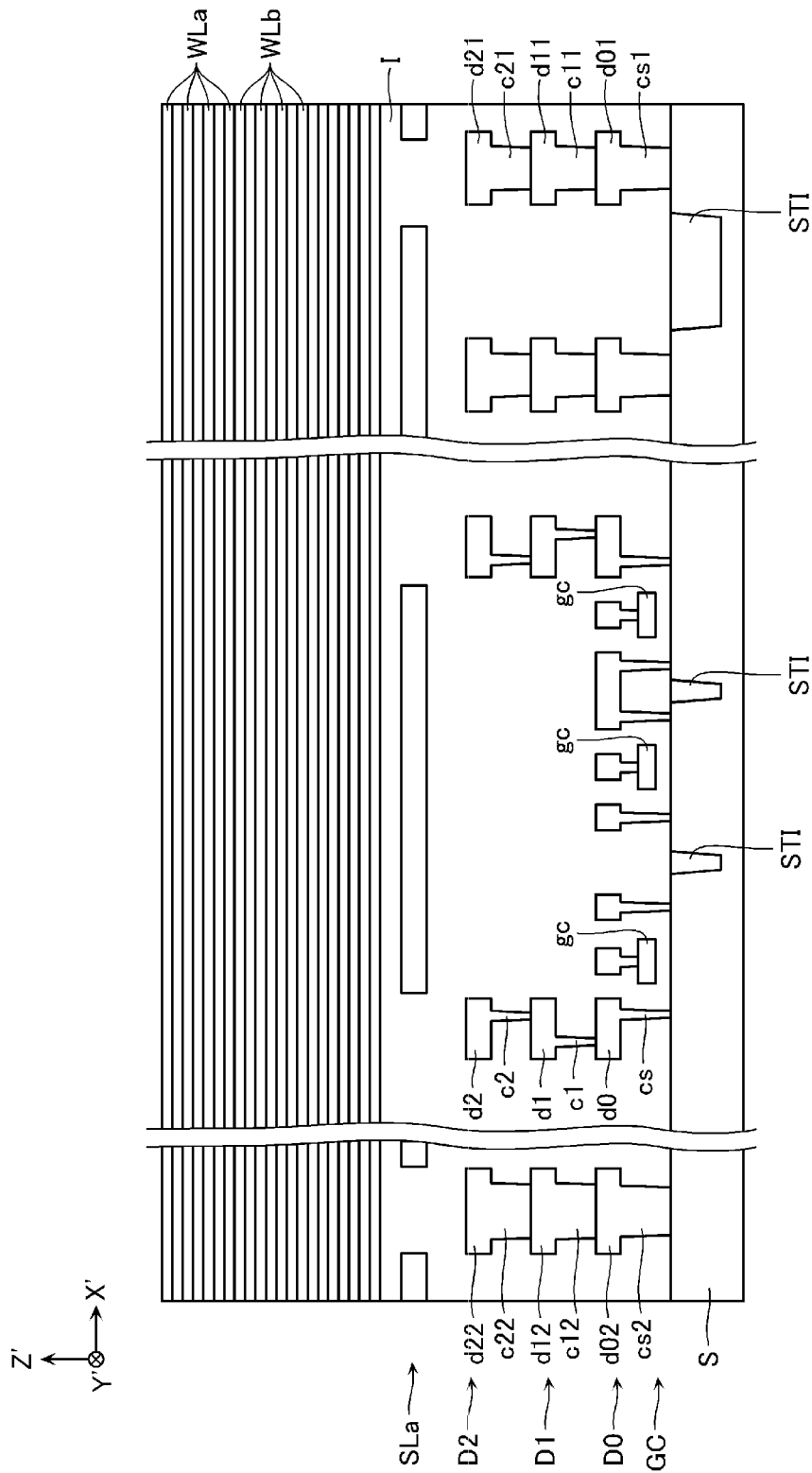

Next, as shown in FIG. 10, the insulating portion I, a semiconductor layer SLa, and the insulating portion I are formed on the upper surface of the metal wiring layer D2. Further, a plurality of sacrificial films WLa and insulating films WLb are alternately formed on the upper surface thereof. The semiconductor layer SLa is, for example, a layer of silicon containing phosphorus or boron. Each of the sacrificial films WLa is, for example, a sacrificial film of silicon nitride. Each of the insulating films WLb is, for example, an insulating film of silicon oxide. This process is performed by CVD, for example. It is noted that patterning of the semiconductor layer SLa is performed by a method such as RIE.

Figure 11:
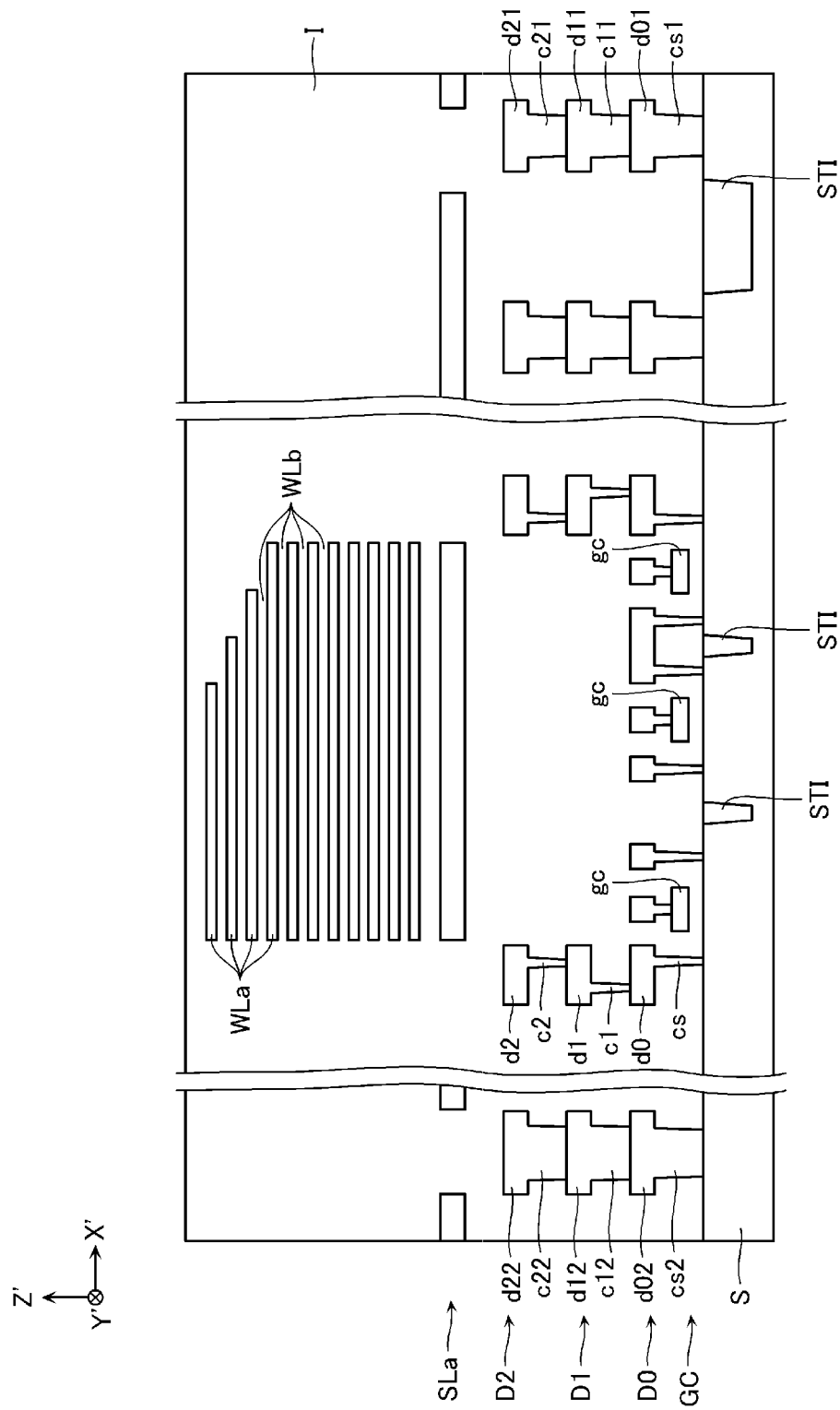

Next, as shown in FIG. 11, a part of the sacrificial film WLa and the insulating film WLb is removed. This process is performed by, for example, RIE and wet etching. Further, the insulating portion I is formed by a method such as CVD.

Figure 12:
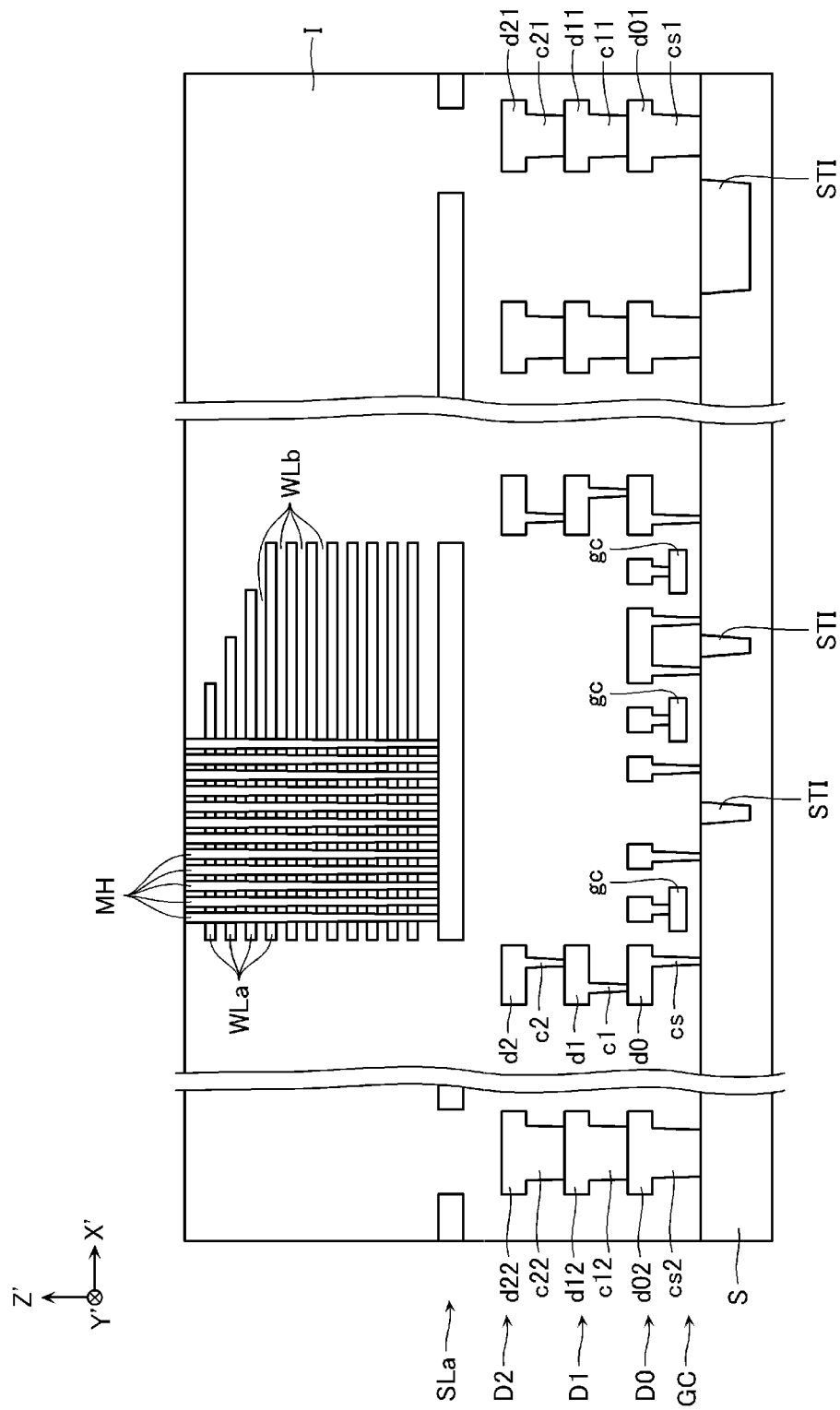

Next, as shown in FIG. 12, the memory structure MH is formed. For example, an opening penetrating the plurality of sacrificial films WLa and the insulating films WLb is formed by a method such as RIE, and a stacked film of silicon oxide, silicon nitride ($Si_3N_4$), silicon oxide, silicon or the like is formed on the inner peripheral surface of the opening by a method such as CVD.

Figure 13:
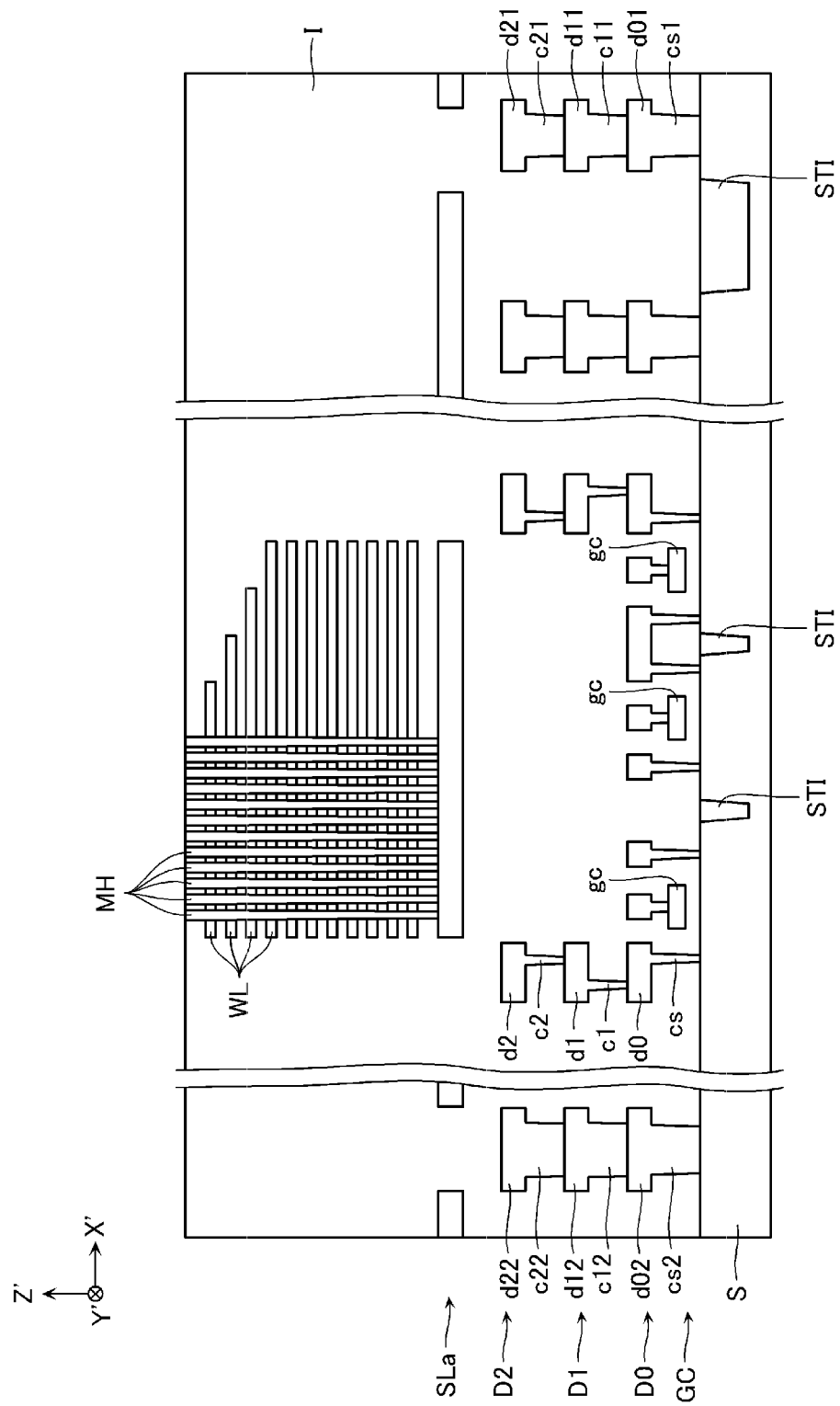

Next, as shown in FIG. 13, the word line WL is formed. This process is performed by, for example, forming a groove, not shown, for dividing the plurality of sacrificial films WLa and the insulating films WLb by a method such as RIE, removing the sacrificial films WLa by a method such as wet etching through the groove, and forming a stacked film of titanium nitride and tungsten by a method such as CVD through the groove. For example, a tungsten film is embedded in the area of the removed sacrificial film by CVD to form the word line WL. That is, the sacrificial film is replaced by the conductive film of the word line WL.

Figure 14:
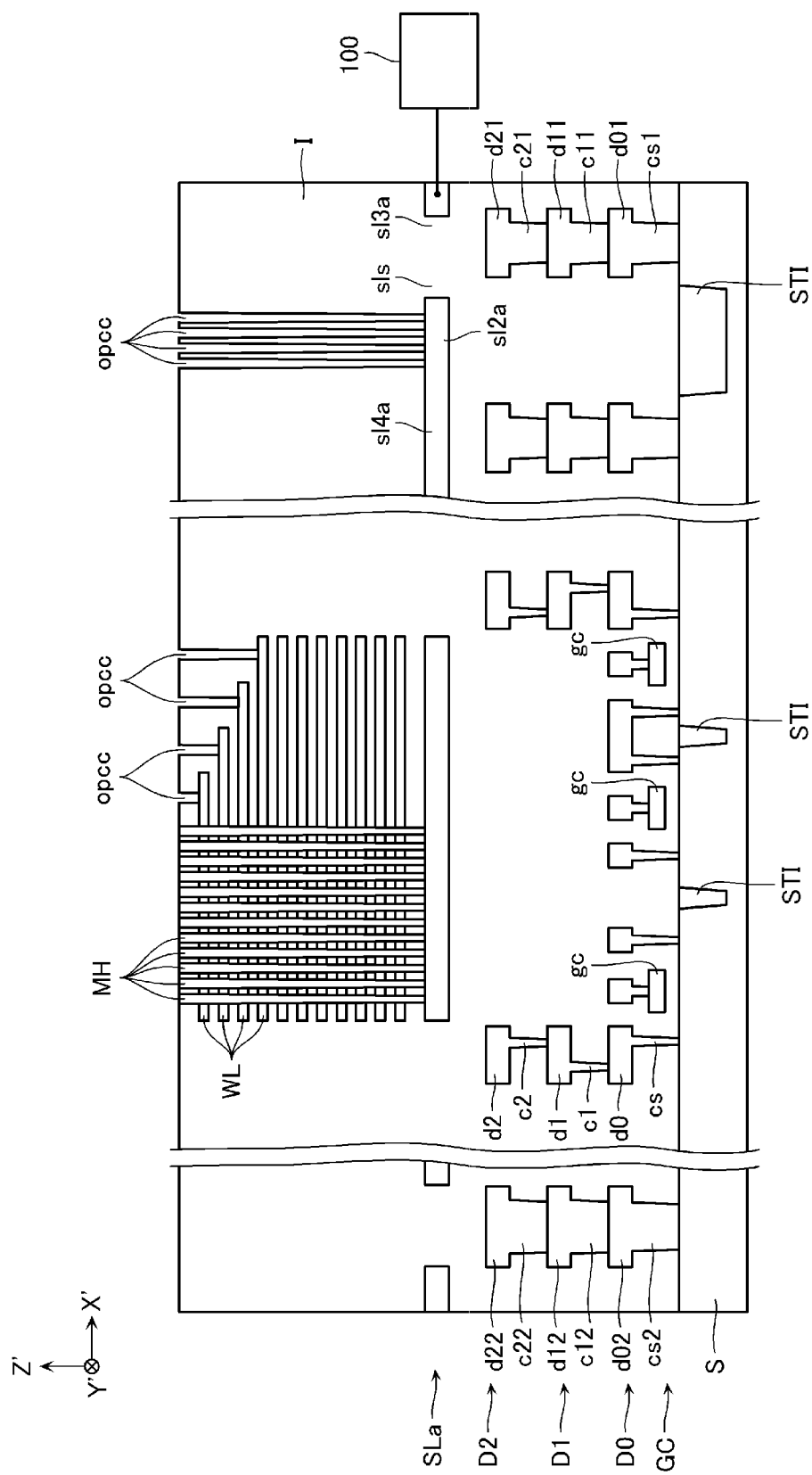
Figure 15:
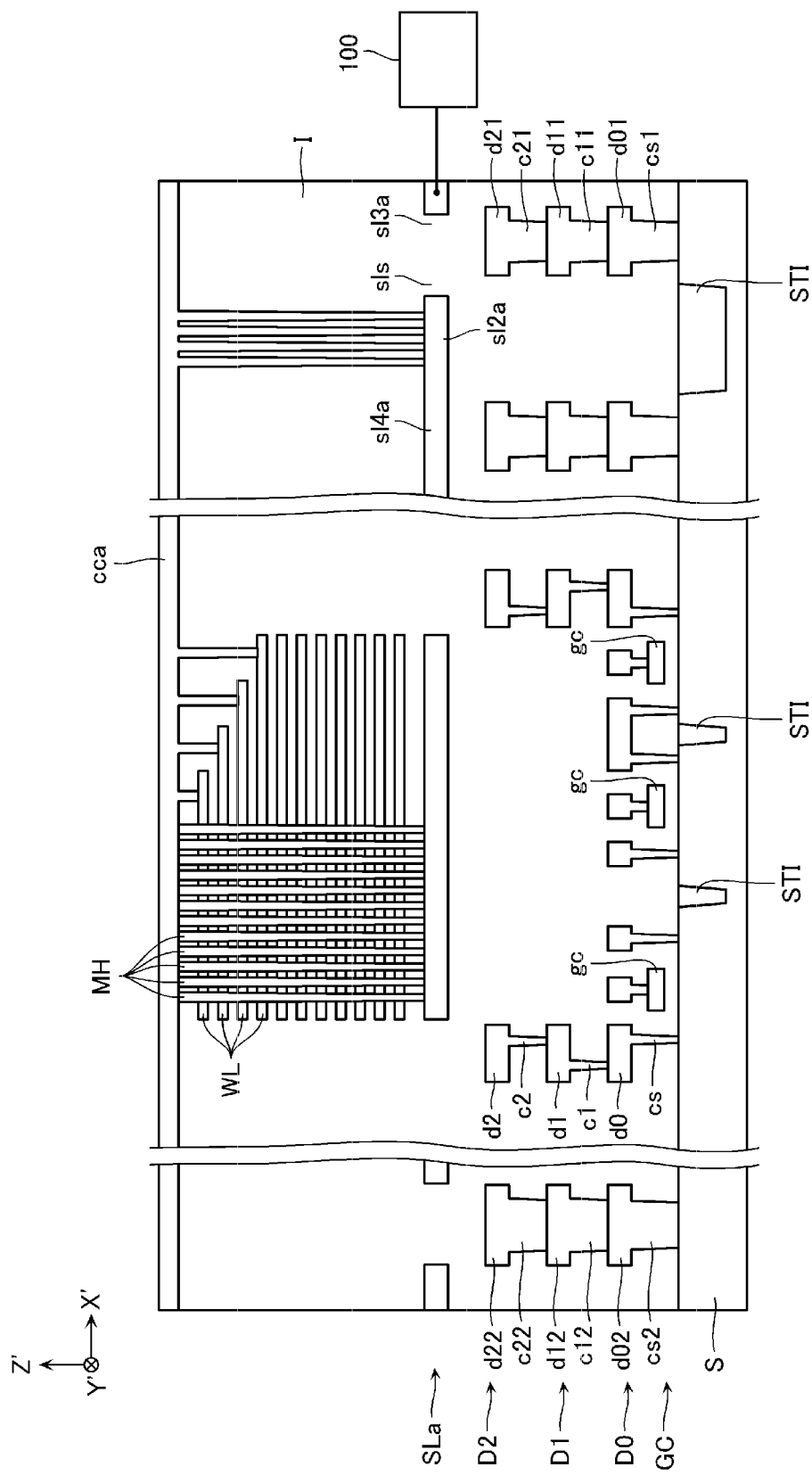
Figure 16:
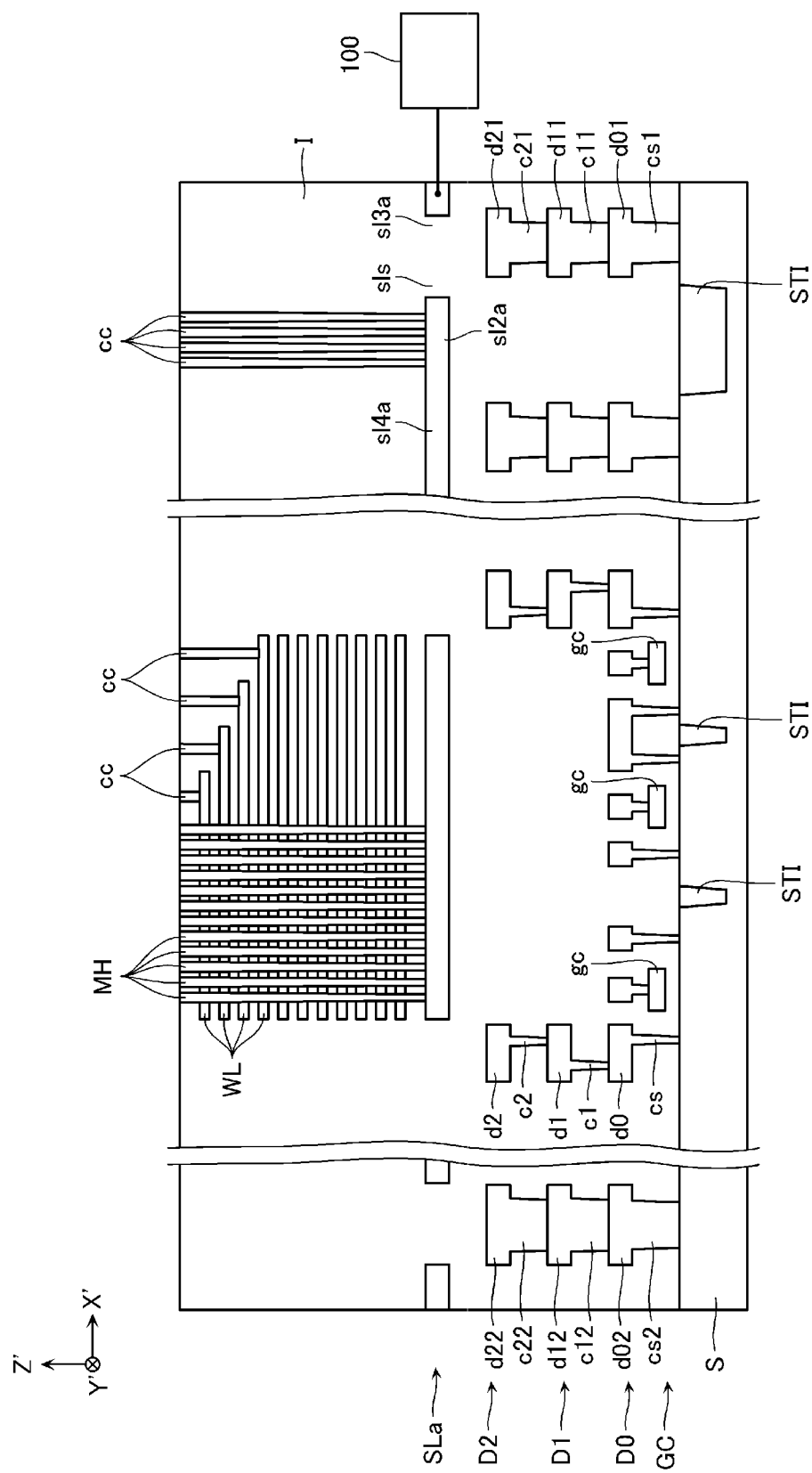

Next, as shown in FIGS. 14 to 17, the contacts cc are formed. This method is performed by using, for example, the damascene method. That is, as shown in FIG. 14, openings opcc are first formed in the insulating portion I by a method such as RIE. Next, as shown in FIG. 15, a stacked film cca of titanium nitride and tungsten is formed by a method such as CVD. Next, as shown in FIG. 16, a part of the stacked film cca is removed by a method such as CMP to form the contacts cc.

Figure 17:
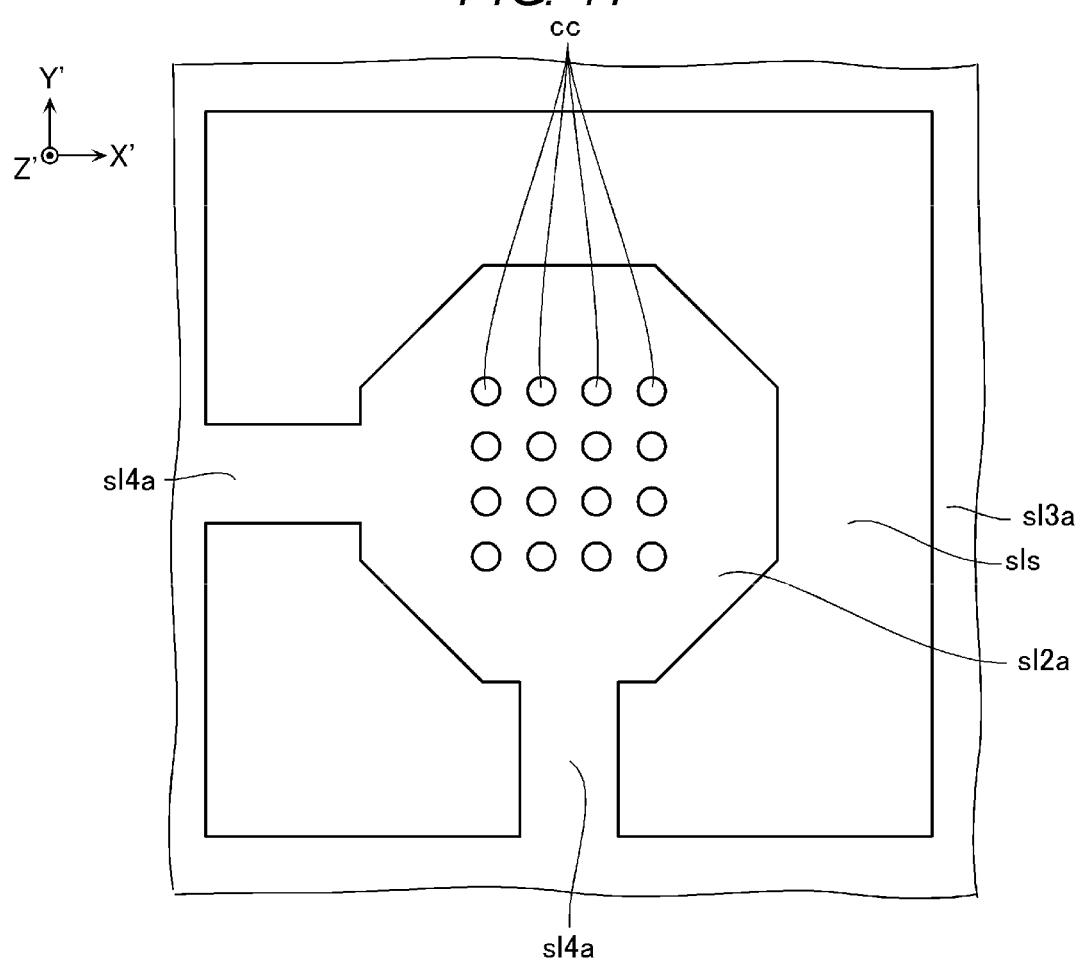
FIG. 17 is a schematic plan view showing one step in the method of manufacturing the semiconductor device according to the first embodiment.

It is noted that the processes shown in FIGS. 14 to 16 are performed with the semiconductor layer SLa connected to an electrostatic discharging apparatus 100. Further, as shown in FIG. 17, these processes are performed in a state where a portion s12a that is to be the semiconductor electrode s12 (FIG. 4) is connected to a portion s13a that is to be the proximity portion s13 (FIG. 4). In the illustrated example, these portions s12a, s13a are connected via a connection portion s14a. It is noted that the connection portion s14a is removed by a method such as RIE after the completion of this process.

Figure 18:
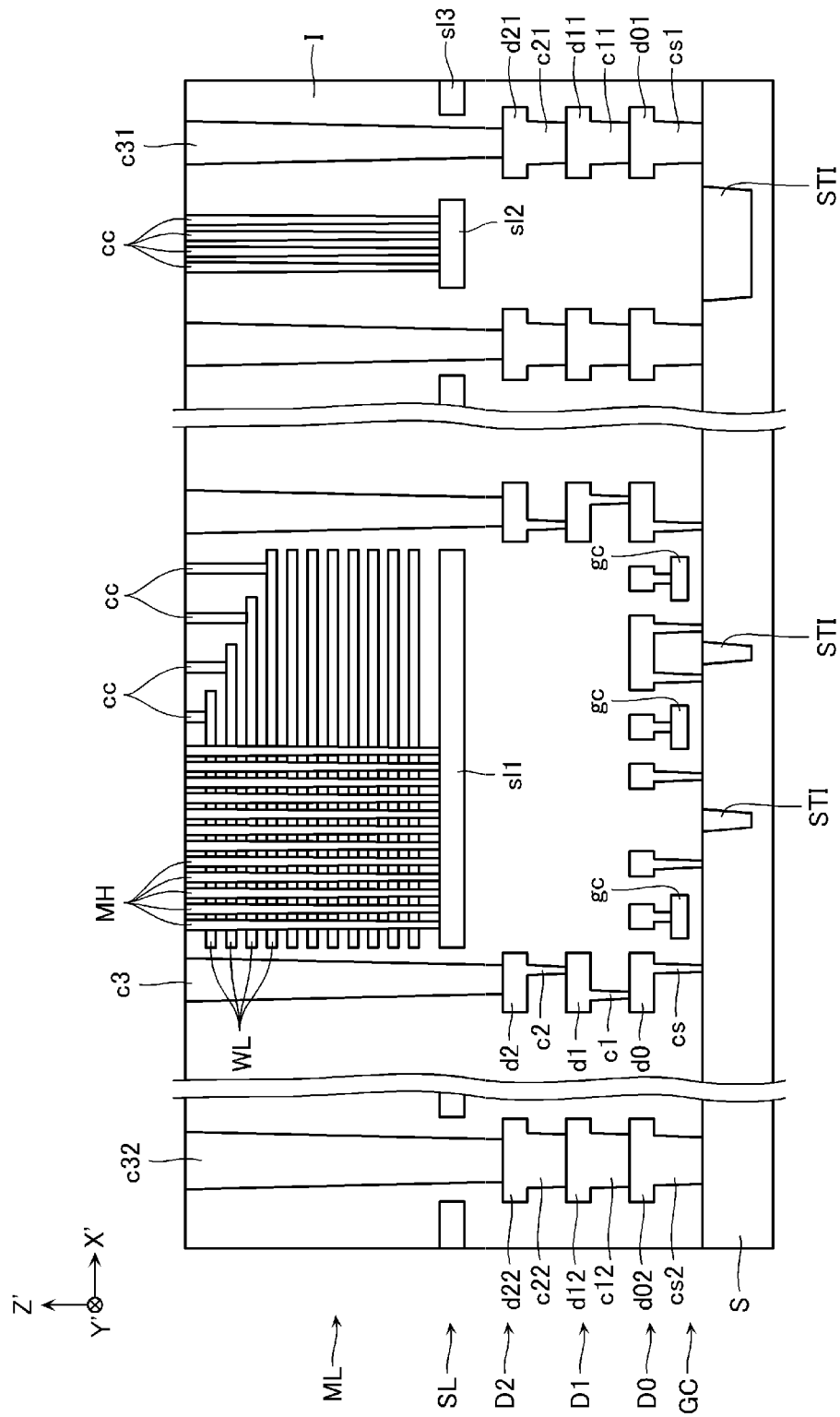

Next, as shown in FIG. 18, the contact c3, tubular portions c31, c32 are formed. This method is performed by, for example, the damascene method.

Figure 19:
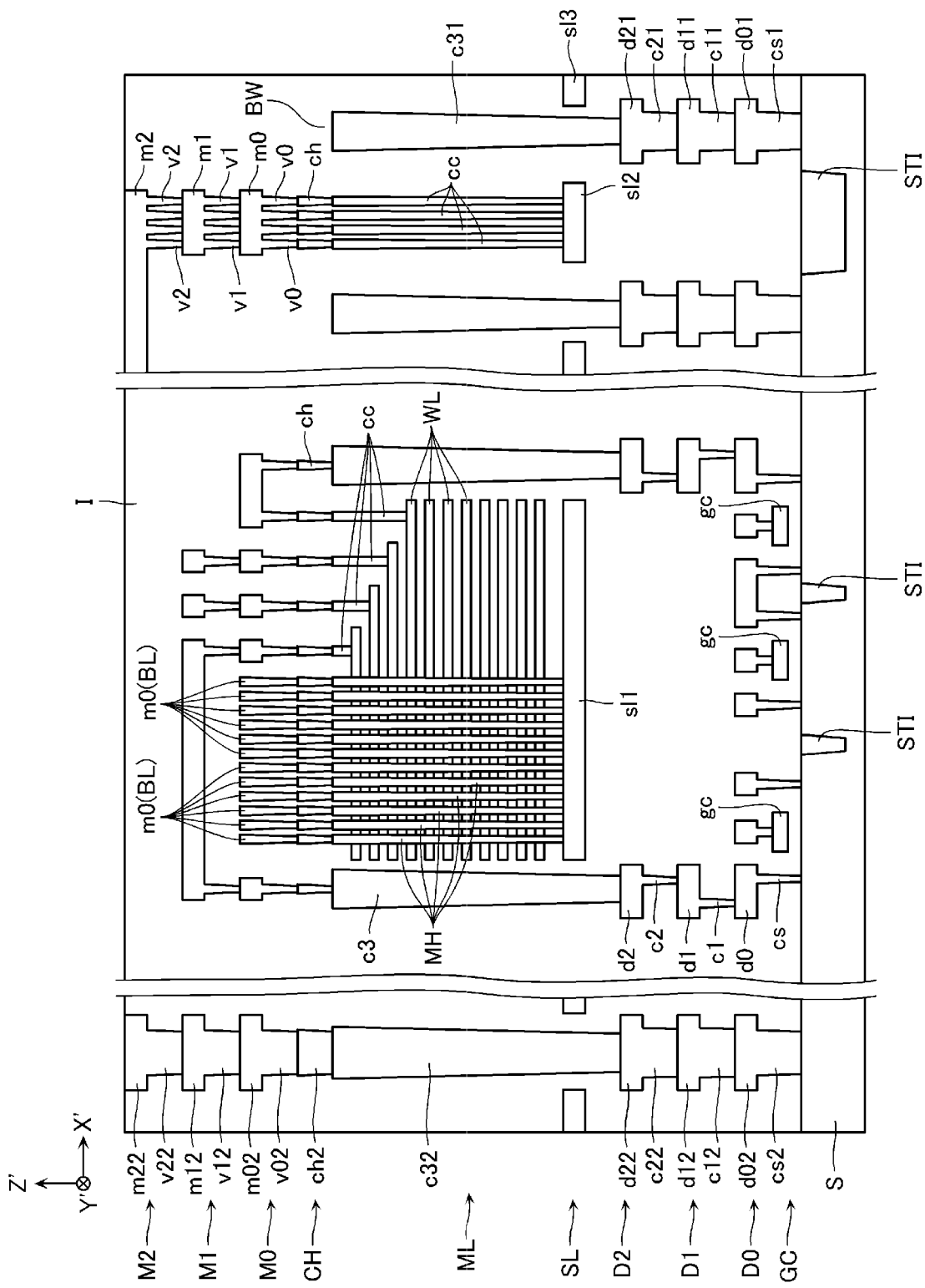

Next, as shown in FIG. 19, the contact layer CH and the metal wiring layers M0, M1, M2 are formed. This process is performed by using, for example, the damascene method.

Figure 20:
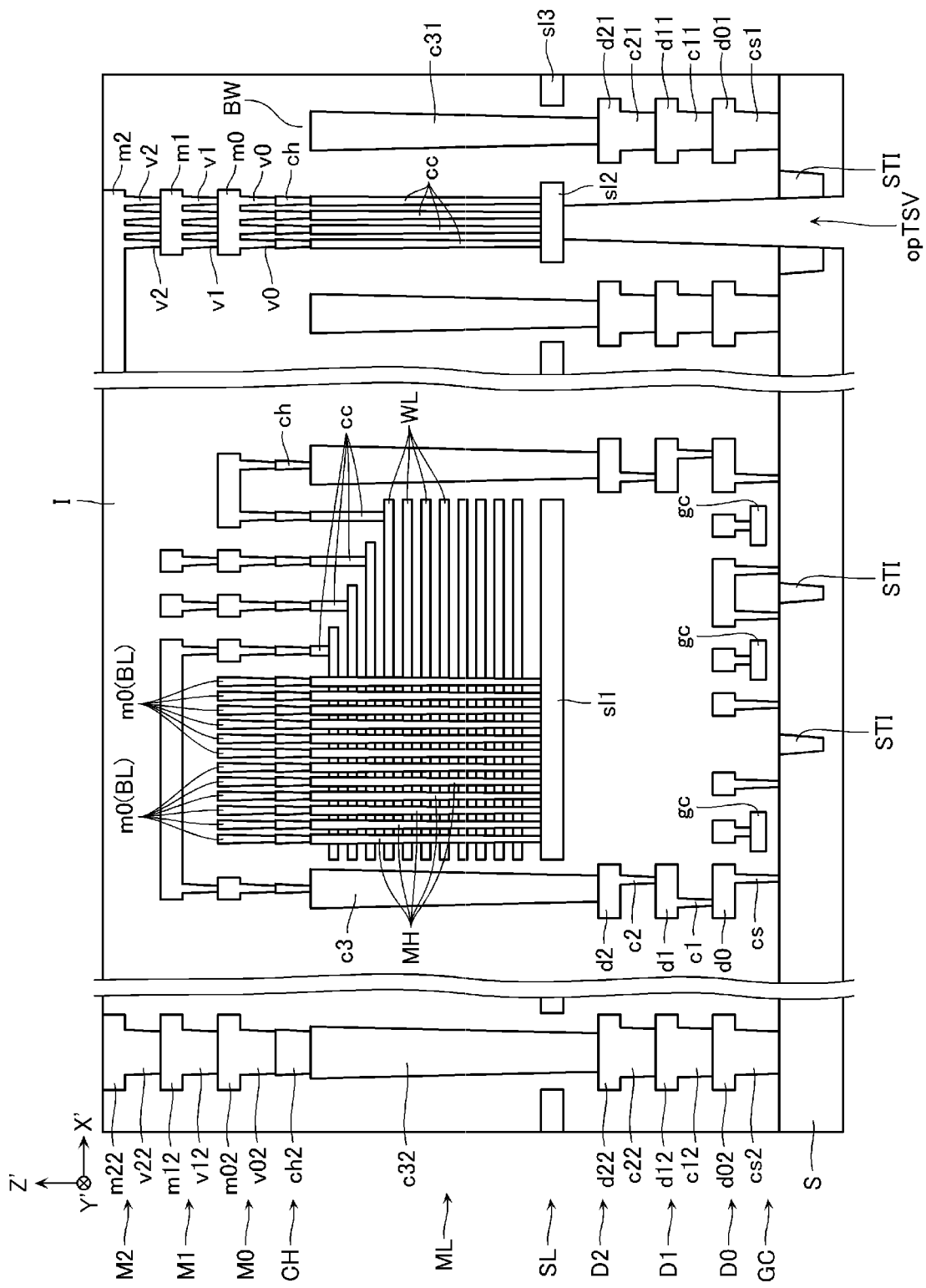

Next, as shown in FIG. 20, an opening opTSV is formed from the bottom surface side of the semiconductor substrate S. The opening opTSV is a through via hole that extends in the Z' direction, and penetrates the semiconductor substrate S and the insulating portion I so as to expose the lower surface of the semiconductor electrode s12. The opening opTSV is formed by a method such as RIE.

Thereafter, the electrode TSV is formed in the opening opTSV by a plating process or the like, and a heat process is performed thereafter, whereby the configuration described with reference to FIG. 3 and the like is formed.

As described with reference to FIG. 4 and the like, the connection portion CP according to the embodiment includes a plurality of contacts cc. In order to reduce the resistance of the connection portion CP, it is desirable that the contacts cc are arranged in a high density configuration.

Here, as described with reference to FIG. 14, in forming the contacts cc, a plurality of openings opcc are formed in the insulating portion I. Therefore, when the contacts cc are arranged in the high density configuration, the openings opcc are formed with the same high density configuration.

However, each opening opcc has a depth (a length in the Z' direction) that is large enough to penetrate all of the plurality of word lines WL arranged in the Z' direction, and it is necessary to perform processing to produce openings with a high aspect ratio. When such processing is performed, a large amount of RIE ions or the like may be deposited on the inner peripheral surface or the like of the opening opcc. In addition, due to charges such as ions, arcing may occur among the components in the metal wiring layer D2, which may result in dielectric breakdown of the insulating portion I, damage of a wafer, or the like.

Therefore, in the embodiment, as described with reference to FIGS. 14 to 17, in forming the opening opcc, the portion s12a, which is to be formed into the semiconductor electrode s12, is connected to the electrostatic discharging apparatus 100. As a result, it is possible to prevent the occurrence of arcing as described above by discharging the electrostatic charges that are generated due to RIE ions.

Here, in such an embodiment, the contacts cc are connected to the upper surface of the semiconductor electrode s12, and the electrode TSV (FIG. 3) is connected to the lower surface of the semiconductor electrode s12. Therefore, the position of the upper end of the electrode TSV is located above the surface of the semiconductor substrate S, and the outer peripheral surface of the electrode TSV is in contact with the insulating portion I (e.g., insulating film I1). Here, a material such as nickel or platinum has a larger diffusion coefficient in silicon oxide or the like forming the insulating portion I (e.g., insulating film I1) and the like than that of a material such as tungsten. If metal atoms such as nickel or platinum diffuse to the circuit CMOS via the insulation portion I, an operation failure or the like may occur.

Therefore, in the embodiment, the barrier wall BW surrounding the connection portion CP is provided. This makes it possible to prevent diffusion of atoms of metal such as nickel and platinum contained in the electrode TSV. As a result, it is possible to provide a semiconductor device which prevents an operation failure in the circuit CMOS.

In addition, in the embodiment, by using the barrier wall BW as a shield, it is possible to reduce the electrostatic capacitance between the adjacent connection portions CP. As a result, it is possible to provide a semiconductor device which increases the speed of communication via the connection portion CP.

Figure 21:
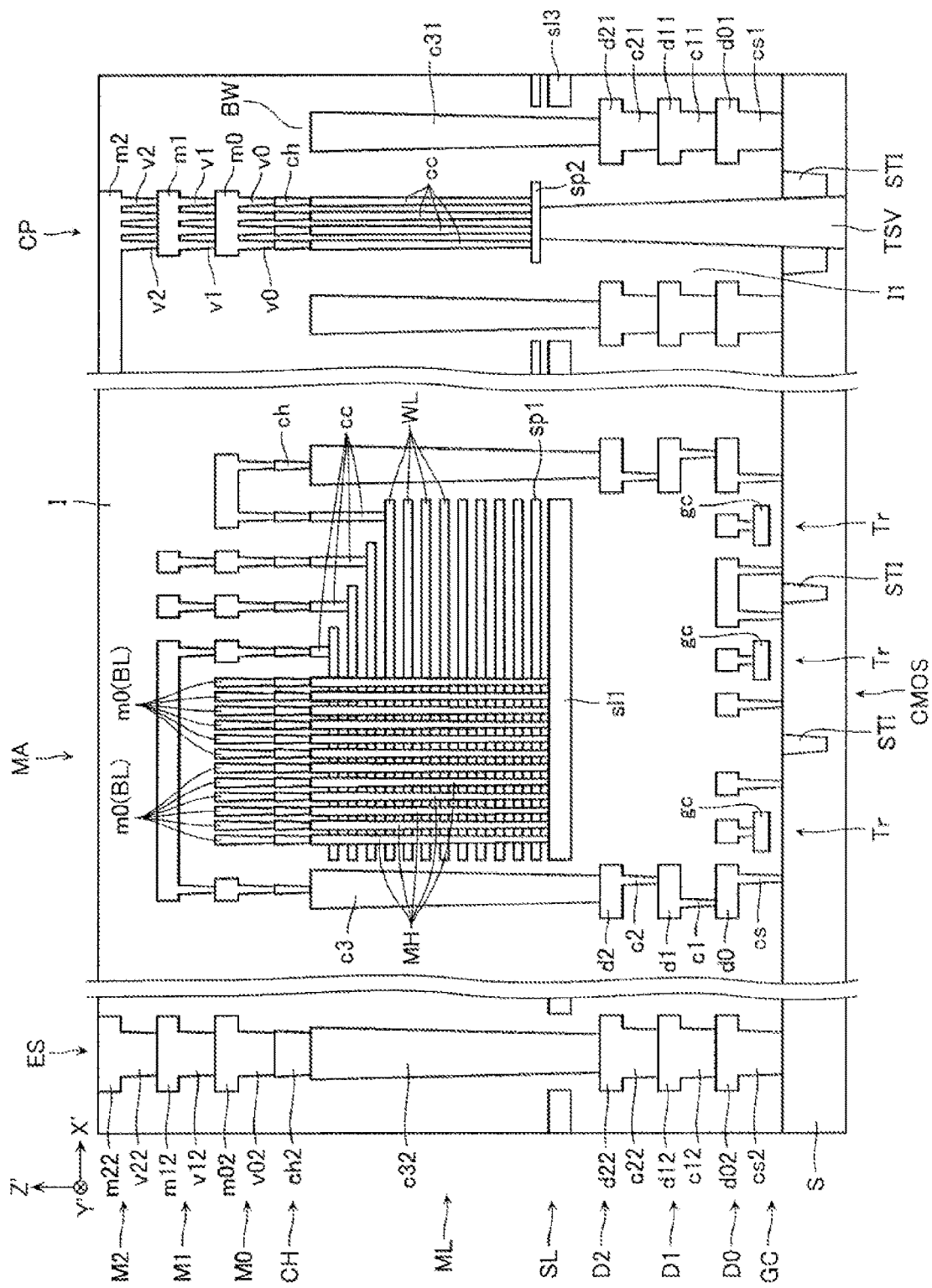
FIG. 21 is a schematic cross-sectional view of a semiconductor device according to a second embodiment.

The second embodiment will be described in accordance with FIG. 21. In the second embodiment, a stopper film sp1 is provided between the semiconductor wiring s11 and the lowest layer of the word lines WL. The stopper film sp1 is provided for a purpose of preventing the condition, for example, in the etching process of the memory structure MH, where the source line s11 is penetrated by over-etching. In the case of forming the stopper film sp1, it is convenient to form the stopper film sp2 at the same time, to which the electrode TSV is connected. Accordingly, in the second embodiment, the electrode TSV is connected to the stopper film sp2. Therefore, different from the first embodiment, the semiconductor electrode s12 may be omitted.

The stopper films sp1, sp2 are, for example, P-type or N-type doped poly-silicon films.

Other Embodiments

The first and second embodiments are shown as an example, and specific aspects and the like of the above-described respective components may be appropriately changed.

For example, in the first and second embodiments, the memory cell array MA is illustrated as an example of the internal circuit of the semiconductor device. However, the internal circuit may be a component other than the memory cell array, for example, an arithmetic processing circuit. Further, the configuration of the memory cell array may also be appropriately changed. For example, the memory cell array MA according to the first embodiment includes a three-dimensional NAND flash memory. However, for example, the memory cell array may include a two-dimensional NAND flash memory or a NOR flash memory. In addition, the memory cell array may include a memory other than the flash memory, such as DRAM, ReRAM, MRAM and PCRAM.

Further, in the first embodiment, the upper end of the electrode TSV is connected to the component in the semiconductor wiring layer SL (e.g., the semiconductor electrode s12). However, the upper end of the electrode TSV may be connected to a component in a wiring layer other than the semiconductor wiring layer SL.

Further, in the second embodiment, the stopper films sp1, sp2 are N-type or P-type doped poly-silicon films. However, it can be any material showing electrical conductivity, for example, a material including metal or metallic compound may be adopted. It is preferable that the material is able to be used as an etch stopper when the memory structure MH is processed.

Further, in the first and second embodiments, nickel and platinum are illustrated as an example of a first atom contained in the electrode TSV. However, the first atom may be appropriately changed. However, it is preferable that the first atom is a metal atom or the like having a lower resistivity than that of a second atom.

In addition, in the first and second embodiments, titanium and tungsten are illustrated as an example of a second atom contained in the barrier wall BW. However, the second atom may be appropriately changed. However, it is preferable that the second atom has a smaller diffusion coefficient in an insulating film of, such as, silicon oxide forming the insulating portion I (e.g., insulating film I1) than that of the first atom. In addition, as illustrated in the first embodiment, by making the second atom contained in the barrier wall BW and an atom contained in the wirings d0, d1, d2 and the like the same atoms, it is possible to form the barrier wall BW without increasing the number of manufacturing processes.

In the first and second embodiments, an electrode, such as nickel (Ni) or platinum (Pt), is used as the electrode TSV. However, copper (Cu) may be used as the electrode TSV. Further, a stacked film of titanium nitride and tungsten is used as the tubular portion c31 of the barrier wall BW, tubular portion of the edge seal ES and metal wiring layers D0, D1, D2. The stacked film is formed by forming a thick tungsten film on a thin titanium nitride film. A stacked film of tungsten nitride and titanium may be used. As the first atom, an atom of a metal selected from at least one of, for example, nickel (Ni), platinum (Pt) and copper (Cu), may be used. As the second atom, an atom of a metal selected from at least one of, for example, tungsten (W), titanium (Ti), tantalum (Ta) and hafnium (Hf), may be used. However, the first atom and the second atom are not limited thereto and may be appropriately changed. It is noted that the material and the like of the insulating portion I (e.g., insulating film I1) may be appropriately changed. For example, the insulating portion I may be made of an insulating material containing, as one of main components, silicon such as silicon oxide, silicon nitride and silicon oxynitride, and containing at least one of oxygen and nitrogen as one of the main components. Further, the insulating portion I may contain another atom. Furthermore, the material of the insulating portion I may be an insulating material containing another atom as a main component.

In addition, in the first and second embodiments, the connection portion CP and the barrier wall BW are electrically insulated from each other. However, it is also possible to electrically connect the connection portion CP and the barrier wall BW, for example, to use the barrier wall BW as a part of the wiring.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate;
   a first electrode provided apart from the surface of the substrate in a first direction intersecting the surface of the substrate;
   a second electrode extending completely through the substrate in the first direction and connected to the first electrode at one end in the first direction;
   a first structure surrounding a side surface of the second electrode;
   a first insulating film provided between the second electrode and the first structure;
   a plurality of first wirings stacked in the first direction;
   a plurality of second insulating films provided between the plurality of first wirings;
   a memory structure extending through the plurality of first wirings and the plurality of second insulating films in the first direction; and
   a wiring layer provided between the memory structure and the substrate, the wiring layer including a second wiring connected to one end of the memory structure in the first direction and including the first electrode,
   wherein the second electrode includes first atoms and the first structure includes second atoms, and
   a diffusion coefficient of the second atoms in the first insulating film is smaller than a diffusion coefficient of the first atoms in the first insulating film.

2. The semiconductor device according to claim 1, wherein
   the first structure surrounds a side surface of the first electrode.

3. The semiconductor device according to claim 1, wherein the second wiring is a source line of the memory structure.

4. The semiconductor device according to claim 1, wherein the second wiring is between a source line of the memory structure and a lowest layer of the first wirings.

5. The semiconductor device according to claim 1, wherein the second wiring is formed simultaneously with the first electrode.

6. The semiconductor device according to claim 1, wherein the first wiring includes a plurality of field-effect transistors.

7. The semiconductor device according to claim 1, comprising:
   a plurality of contacts extending in the first direction farther from the substrate than the first electrode, and connected to the first electrode at one end of the contacts in the first direction on an opposite side of the first electrode as the second electrode.

8. The semiconductor device according to claim 1, wherein the first structure has a tubular shape.

9. The semiconductor device according to claim 1, wherein the first atoms are metal atoms of at least one of nickel, platinum and copper.

10. The semiconductor device according to claim 1, wherein the second atoms are metal atoms of at least one of tungsten, titanium, tantalum and hafnium.

11. The semiconductor device according to claim 1, wherein the first atoms have lower resistivity than the second atoms.

12. The semiconductor device according to claim 1, further comprising:
    a second structure surrounding a memory cell array and the first structure, wherein the second structure includes the second atoms.

13. A semiconductor device, comprising:
    a substrate;
    a first electrode provided apart from the surface of the substrate in a first direction intersecting the surface of the substrate;
    a second electrode extending completely through the substrate in the first direction and connected to the first electrode at one end in the first direction;
    a first structure surrounding a side surface of the second electrode;
    a first insulating film provided between the second electrode and the first structure;
    a plurality of first wirings stacked in the first direction;
    a plurality of second insulating films provided between the plurality of first wirings;
    a memory structure extending through the plurality of first wirings and the plurality of second insulating films in the first direction; and
    a wiring layer provided between the memory structure and the substrate, the wiring layer including a source line of the memory structure and the first electrode,
    wherein the second electrode includes first atoms and the first structure includes second atoms, and
    a diffusion coefficient of the second atoms in the first insulating film is smaller than a diffusion coefficient of the first atoms in the first insulating film.

14. The semiconductor device according to claim 13, wherein the first atoms are metal atoms of at least one of nickel, platinum and copper.

15. The semiconductor device according to claim 13, wherein the second atoms are metal atoms of at least one of tungsten, titanium, tantalum and hafnium.

16. A semiconductor device, comprising:
    a substrate;
    a first electrode provided apart from the surface of the substrate in a first direction intersecting the surface of the substrate;
    a second electrode extending completely through the substrate in the first direction and connected to the first electrode at one end in the first direction;
    a first structure surrounding a side surface of the second electrode;
    a first insulating film provided between the second electrode and the first structure;
    a plurality of first wirings stacked in the first direction;
    a plurality of second insulating films provided between the plurality of first wirings;
    a memory structure extending through the plurality of first wirings and the plurality of second insulating films in the first direction; and
    a wiring layer provided between the memory structure and the substrate, the wiring layer including a second wiring that is between a source line of the memory structure and a lowest layer of the first wirings and including the first electrode, wherein the second electrode includes first atoms and the first structure includes second atoms, and a diffusion coefficient of the second atoms in the first insulating film is smaller than a diffusion coefficient of the first atoms in the first insulating film.

17. The semiconductor device according to claim 16, wherein the first atoms are metal atoms of at least one of nickel, platinum and copper.

18. The semiconductor device according to claim 16, wherein the second atoms are metal atoms of at least one of tungsten, titanium, tantalum and hafnium.

* * * * *